US010601346B2

(12) United States Patent
Bae et al.

(10) Patent No.: US 10,601,346 B2
(45) Date of Patent: Mar. 24, 2020

(54) ELECTROSTATIC CHUCK AND ELECTROSTATIC ADSORPTION APPARATUS

(71) Applicant: SAMSUNG DISPLAY CO., LTD., Yongin-si, Gyeonggi-do (KR)

(72) Inventors: Min Ho Bae, Cheonan-si (KR); Byung-Moo Kim, Suwon-si (KR); Yun Soo Kim, Asan-si (KR); Tae-Ho Youn, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 319 days.

(21) Appl. No.: 15/797,488

(22) Filed: Oct. 30, 2017

(65) Prior Publication Data
US 2018/0123486 A1    May 3, 2018

(30) Foreign Application Priority Data

Nov. 3, 2016 (KR) .......... 10-2016-0146022

(51) Int. Cl.
*H02N 13/00* (2006.01)
*H01L 21/68* (2006.01)
*H01L 21/683* (2006.01)
*H01L 21/687* (2006.01)

(52) U.S. Cl.
CPC .......... *H02N 13/00* (2013.01); *H01L 21/681* (2013.01); *H01L 21/6831* (2013.01); *H01L 21/6833* (2013.01); *H01L 21/68757* (2013.01)

(58) Field of Classification Search
CPC ... H02N 13/00; H01L 21/681; H01L 21/6831; H01L 21/6833; H01L 21/68757
USPC .......................................................... 361/234
See application file for complete search history.

(56) References Cited

U.S. PATENT DOCUMENTS

| | | | | |
|---|---|---|---|---|
| 4,502,094 A | * | 2/1985 | Lewin | ................. H01L 21/6831 118/500 |
| 5,982,986 A | * | 11/1999 | Davenport | ........ H01L 21/67103 392/418 |
| 8,081,317 B2 | | 12/2011 | Kalkowski et al. | |
| 2002/0078889 A1 | * | 6/2002 | Welch | ............... H01L 21/67259 118/668 |

FOREIGN PATENT DOCUMENTS

| | | |
|---|---|---|
| JP | 2001-219331 A | 8/2001 |
| KR | 10-2008-0081014 A | 9/2008 |
| KR | 10-2010-0001920 A | 1/2010 |
| KR | 10-0984748 B1 | 9/2010 |
| KR | 10-2011-0020221 A | 3/2011 |

* cited by examiner

*Primary Examiner* — Kevin J Comber
(74) *Attorney, Agent, or Firm* — Lewis Roca Rothgerber Christie LLP

(57) ABSTRACT

An electrostatic chuck and an electrostatic adsorption apparatus are provided. According to one or more exemplary embodiments, an electrostatic chuck includes: a main body portion including a body portion provided with a through-hole, and a transparent resin portion filled in the through-hole; a transparent cushion layer on the main body portion and covering the transparent resin portion; an electrode layer on the transparent cushion layer; and a dielectric layer on the electrode layer.

13 Claims, 8 Drawing Sheets

FIG. 6

| Classification | | Comparative example | Experimental example |
|---|---|---|---|
| Lens | Material | Silicone | High hardness PC |
| | Hardness (Shore-C) | 85.5 | 98 |
| | Fixed method | Fixed bracket application | Transparent resin portion press-fitted (Inside Al body) |
| Cushion | Material | PE-based material | Acrylic |
| | Thickness | 0.6mm | 1mm |
| | Hardness (Shore-C) | 85 | 90 |
| | Design | Separation type of lens region | Integral type of entire surface |
| | Color | Black or White | Transparent |

FIG. 7

| Item | | Comparative example Bonding evaluation number: 20,000 | Experimental example Bonding evaluation number: 90,000 | Note |
|---|---|---|---|---|
| Deviation of pressed amount of cushion (unit: μm) | Max-Min | 65 | 35 | [Evaluation condition]<br>- Bonding depth: 100 μm<br>- Bonding holding time: 2 sec<br>- Performing in normal pressure/atmosphere state<br>: Vacuum-bonding not performed (Vacuum pump not available) |
| | Avg | 28 | 19 | |

ELECTROSTATIC CHUCK AND ELECTROSTATIC ADSORPTION APPARATUS

CROSS-REFERENCE TO RELATED APPLICATION

This application claims priority to and the benefit of Korean Patent Application No. 10-2016-0146022, filed on Nov. 3, 2016 in the Korean Intellectual Property Office, the entire content of which is incorporated herein by reference.

BACKGROUND

1. Field

Aspects of embodiments of the present disclosure relate to an electrostatic chuck and an electrostatic adsorption apparatus.

2. Description of the Related Art

Generally, an electrostatic chuck is an apparatus that adsorbs an adsorption target, such as a substrate or a wafer, using static electricity.

A conventional electrostatic chuck includes an electrode layer and a dielectric layer positioned on the electrode layer.

Recently, in a case of adsorbing a substrate as an adsorption target, an electrostatic chuck including a cushion layer for suppressing breakage of the substrate has been used.

For example, when a window is bonded on the substrate through an adhesive layer, the substrate and the window may be respectively adsorbed to different electrostatic chucks, and then the different electrostatic chucks are pressed against each other to perform the bonding of the window and the substrate.

While the adsorption target such as the substrate, the window, or the like is adsorbed to the electrostatic chuck, the adsorption target is aligned with respect to the electrostatic chuck.

The above information disclosed in this Background section is only for enhancement of understanding of the background of the described technology and, therefore, it may contain information that does not form the prior art that is already known in this country to a person of ordinary skill in the art.

SUMMARY

According to an aspect of embodiments of the present disclosure, an electrostatic chuck and an electrostatic adsorption apparatus may easily align an adsorption target.

According to another aspect of embodiments of the present disclosure, an electrostatic chuck and an electrostatic adsorption apparatus may prevent or suppress an adsorption target from being broken.

According to another aspect of embodiments of the present disclosure, an electrostatic chuck and an electrostatic adsorption apparatus may be suppressed from deformation by pressure of an adsorption target.

According to another aspect of embodiments of the present disclosure, an electrostatic chuck and an electrostatic adsorption apparatus may be used with sizes of various adsorption targets without replacing the electrostatic chuck.

According to one or more exemplary embodiments of the present disclosure, an electrostatic chuck includes: a main body portion including a body portion provided with a through-hole, and a transparent resin portion filled in the through-hole; a transparent cushion layer on the main body portion and covering the transparent resin portion; an electrode layer on the transparent cushion layer; and a dielectric layer on the electrode layer.

The transparent resin portion may have a hardness greater than a hardness of the transparent cushion layer.

An adsorption target having a polygonal shape in a planar view may be adsorbed on the dielectric layer, and the transparent resin portion may correspond to a corner of the adsorption target.

The adsorption target may have a quadrangular shape in the planar view, the transparent resin portion may include four transparent resin portions, and the four transparent resin portions may correspond to four corners of the adsorption target.

The transparent cushion layer may be thicker than the electrode layer and the dielectric layer.

The transparent cushion layer may be in contact with the transparent resin portion.

The electrostatic chuck may further include a first adhesive layer between the transparent cushion layer and the electrode layer, and an insulation layer between the first adhesive layer and the electrode layer.

The electrode layer may be in contact with the insulation layer.

The electrostatic chuck may further include a second adhesive layer between the electrode layer and the dielectric layer.

The insulation layer may include a same material as the dielectric layer.

The electrode layer may be provided with an opening overlapping the transparent resin portion.

According to another embodiment of the present disclosure, an electrostatic adsorption apparatus includes: an electrostatic chuck that includes a main body portion including a body portion provided with a through-hole and a transparent resin portion filled in the through-hole, a transparent cushion layer on the main body portion and covering the transparent resin portion, an electrode layer on the transparent cushion layer, and a dielectric layer on the electrode layer; an illumination device arranged below the main body portion and corresponding to the transparent resin portion; and a camera arranged above the dielectric layer and corresponding to the transparent resin portion.

According to an aspect of embodiments of the electrostatic chuck and the electrostatic adsorption apparatus of the present disclosure, it is possible to easily align an adsorption target.

In addition, according to an aspect of embodiments of the electrostatic chuck and the electrostatic adsorption apparatus of the present disclosure, it is possible to prevent or suppress an adsorption target from being broken.

Further, according to an aspect of embodiments of the electrostatic chuck and the electrostatic adsorption apparatus of the present disclosure, it is possible to suppress them from being deformed by pressure of an adsorption target.

Still further, according to an aspect of embodiments of the electrostatic chuck and the electrostatic adsorption apparatus of the present disclosure, they may be used corresponding to sizes of various adsorption targets without replacing the electrostatic chuck.

BRIEF DESCRIPTION OF THE DRAWINGS

FIG. 6 illustrates a table of respective conditions of an electrostatic chuck according to a comparative example and an electrostatic chuck according to an experimental example.

FIG. 7 illustrates a result table for comparing an electrostatic chuck according to a comparative example and an electrostatic chuck according to an experimental example.

DETAILED DESCRIPTION

Figure 1:
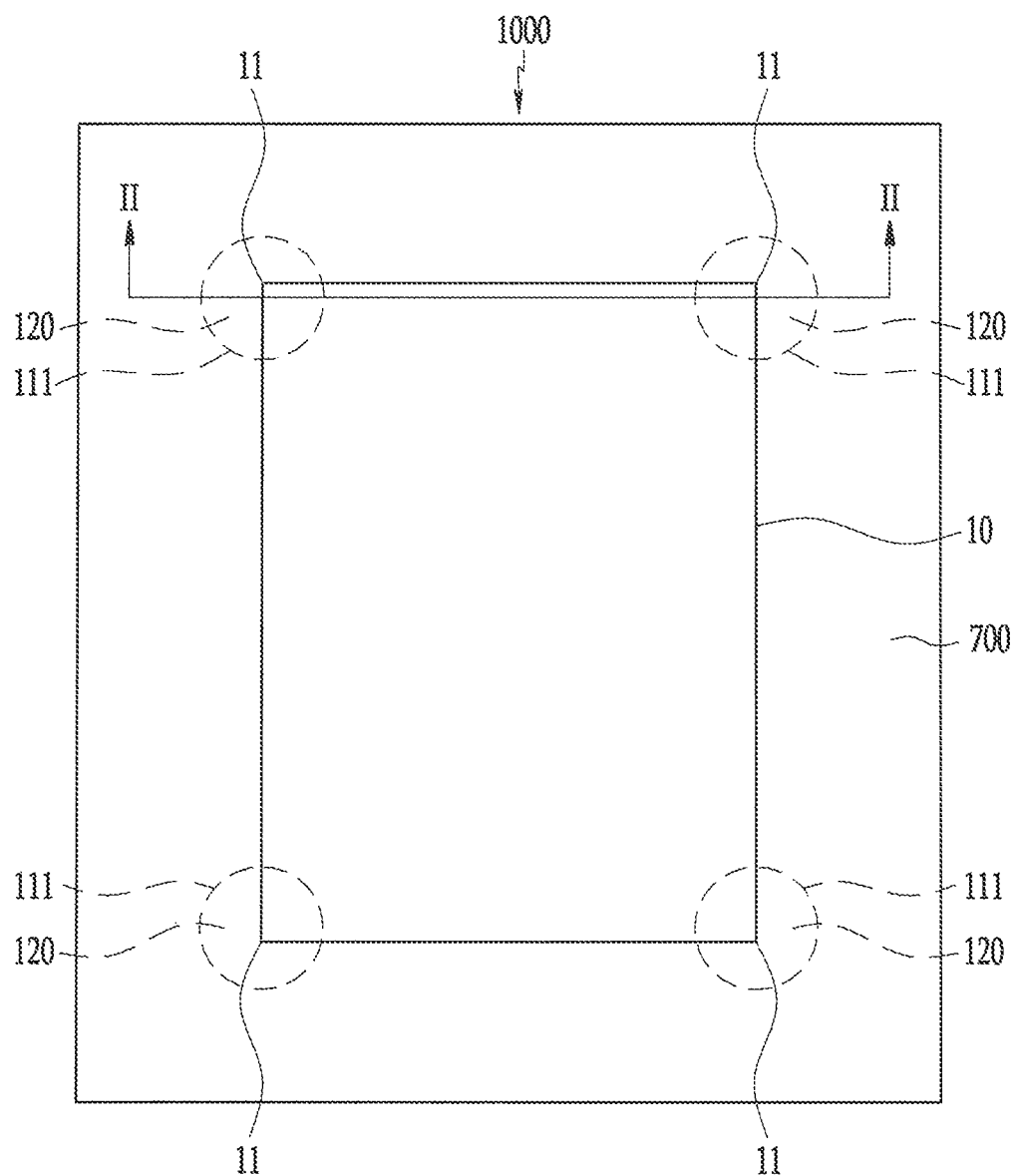
FIG. 1 illustrates a top plan view of an electrostatic chuck according to an exemplary embodiment.

The present disclosure will be described more fully herein with reference to the accompanying drawings, in which some exemplary embodiments of the present invention are shown. As those skilled in the art would realize, the described embodiments may be modified in various different ways, all without departing from the spirit or scope of the present invention.

Parts that are irrelevant to the description may be omitted to clearly describe the present disclosure, and like reference numerals designate like elements throughout the specification.

The size and thickness of each component shown in the drawings may be arbitrarily shown for better understanding and ease of description, but the present disclosure is not limited thereto.

In addition, it is to be understood that when an element is referred to as being "on" another element, it can be directly on the other element, or one or more intervening elements may also be present. In contrast, when an element is referred to as being "directly on" another element, there are no intervening elements present. Further, in the specification, the words "on" or "above" mean positioned on or below the object portion, and do not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements. Further, as used herein, the singular forms "a," "an," and "the" are intended to include the plural forms as well, unless the context clearly indicates otherwise.

Herein, an electrostatic chuck according to an exemplary embodiment will be described with reference to FIG. 1 and FIG. 2. In the following exemplary embodiments, a planar quadrangular substrate as an adsorption target adsorbed to the electrostatic chuck will be exemplarily described, but the present disclosure is not limited thereto. For example, the adsorption target adsorbed to the electrostatic chuck may have any of various shapes in a planar view, such as a polygonal shape, a circular shape, a planar elliptical shape, a planar closed loop shape, and the like.

Figure 2:
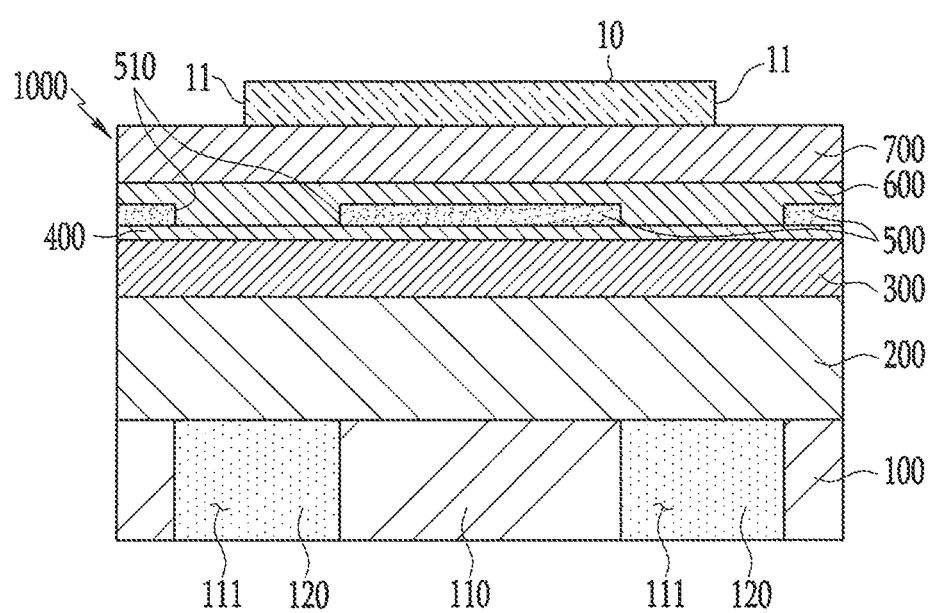
FIG. 2 illustrates a cross-sectional view of the electrostatic chuck of FIG. 1, taken along the line II-II.

FIG. 1 illustrates a top plan view of an electrostatic chuck according to an exemplary embodiment; and FIG. 2 illustrates a cross-sectional view of the electrostatic chuck of FIG. 1, taken along the line II-II.

Referring FIG. 1 and FIG. 2, an electrostatic chuck 1000 adsorbs a substrate 10 having a quadrangular shape in a planar view as an adsorption target. The substrate 10 is provided with four corners 11 in a planar view. In an embodiment, the electrostatic chuck 1000 includes a main body portion 100, a transparent cushion layer 200, a first adhesive layer 300, an insulation layer 400, an electrode layer 500, a second adhesive layer 600, and a dielectric layer 700.

The main body portion 100 includes a body portion 110 and a transparent resin portion 120.

In an embodiment, the body portion 110 includes four through-holes 111 corresponding to the four corners 11 of the substrate 10. The body portion 110 may include a plurality of through-holes 111. In an embodiment, the body portion 110 may include a metal, such as aluminum, iron, copper, or stainless steel.

The through-hole 111 corresponds to the corner 11 of the substrate 10. The through-hole 111 is formed to pass through the body portion 110. In an embodiment, the through-hole 111 may have a circular shape in a planar view, but is not limited thereto and, in other embodiments, may have any of various shapes, such as a polygonal shape, a circular shape, an elliptical shape, and a closed loop shape in a planar view.

The transparent resin portion 120 is filled in the through-hole 111. In an embodiment, the transparent resin portion 120 may be formed by being press-fitted into the through-hole 111. In an embodiment, the number of transparent resin portions 120 is four, and the four transparent resin portions 120 correspond to the four corners 11 of the substrate 10. The transparent resin portion 120 has a hardness greater than a hardness of the transparent cushion layer 200 disposed on the transparent resin portion 120. For example, the transparent resin portion 120 may have a shore hardness of 95 to 100. In an embodiment, the transparent resin portion 120 may have a shore hardness of 98 or about 98.

In an embodiment, since the transparent resin portion 120 has a greater hardness than the transparent cushion layer 200, even though the transparent cushion layer 200 is deformed by a pressure due to the substrate 10, deformation of the transparent resin portion 120 is suppressed by the transparent cushion layer 200.

The transparent resin portion 120 includes a polymer material, such as a polycarbonate.

Light formed by illuminating may be irradiated to the substrate 10 through the transparent resin portion 120, and the light may be used in an alignment process of the substrate 10 with respect to the electrostatic chuck 1000.

The transparent cushion layer 200 is disposed on the main body portion 100. The transparent cushion layer 200 covers the transparent resin portion 120 and the body portion 110. That is, the transparent cushion layer 200 covers the main body portion 100.

The transparent cushion layer 200 is in contact with the transparent resin portion 120. In an embodiment, the transparent cushion layer 200 may be deposited or coated on the transparent resin portion 120. Further, in an embodiment, the transparent cushion layer 200 is thicker than the electrode layer 500 and the dielectric layer 700.

Since the transparent cushion layer 200 is thicker than the dielectric layer 700, the transparent cushion layer 200 is deformed by the pressure due to the substrate 10, and, thus, the substrate 10 is suppressed from being damaged by the pressure.

The transparent cushion layer 200 includes a polymer material, such as acrylic.

The transparent cushion layer 200 may have shore hardness of 85 to 95. In an embodiment, the transparent cushion layer 200 may have a shore hardness of 90 or about 90.

The transparent cushion layer 200 has a hardness less than the hardness of the transparent resin portion 120.

In an embodiment, the transparent cushion layer 200 covers an entire surface of the main body portion 100 including the transparent resin portion 120 and has a hardness less than the hardness of the transparent resin portion 120, such that the pressure due to the substrate 10 may be equally applied to an entire region of the transparent cushion layer 200, and, thus, one region of the transparent cushion layer 200 may be suppressed from being further deformed compared to another region thereof.

Therefore, since one region of the transparent cushion layer 200 is suppressed from being further deformed compared to the other region thereof, one portion of the substrate 10 corresponding to the one region of the transparent cushion layer 200 may be suppressed from being further deformed compared to the other portion thereof.

The first adhesive layer 300 is disposed between the transparent cushion layer 200 and the electrode layer 500. Further, the first adhesive layer 300 is disposed between the transparent cushion layer 200 and the insulation layer 400. The first adhesive layer 300 bonds the transparent cushion layer 200 and the insulation layer 400. The first adhesive layer 300 may include a transparent polymer material.

The insulation layer 400 is disposed between the first adhesive layer 300 and the electrode layer 500. In an embodiment, the insulation layer 400 is in contact with the electrode layer 500. The electrode layer 500 may be deposited on a surface of the insulation layer 400. The insulation layer 400 may include a same material as the dielectric layer 700. In an embodiment, the insulation layer 400 includes a transparent polymer material.

In an embodiment, the insulation layer 400 includes a polymer material, such as a polyimide.

The electrode layer 500 is disposed on the transparent cushion layer 200. The electrode layer 500 is disposed between the insulation layer 400 and the second adhesive layer 600. In an embodiment, the electrode layer 500 is in contact with the insulation layer 400. The electrode layer 500 may be deposited on a surface of the insulation layer 400. The electrode layer 500 may include a plurality of electrode patterns to which power of different polarities is applied, and the plurality of electrode patterns may have any of various known shapes. In an embodiment, the electrode layer 500 may include a plate-shaped electrode.

The electrode layer 500 includes an opening 510 overlapping the transparent resin portion 120. The opening 510 corresponds to the corner 11 of the substrate 10.

The electrode layer 500 includes a conductive material, such as copper, aluminum, gold, silver, platinum, carbon nanotubes, a conductive polymer, or a transparent conductive oxide.

The second adhesive layer 600 is disposed between the electrode layer 500 and the dielectric layer 700. The second adhesive layer 600 bonds the electrode layer 500 and the dielectric layer 700. In an embodiment, the second adhesive layer 600 includes a transparent polymer material.

The dielectric layer 700 is disposed on the electrode layer 500. The substrate 10 is adsorbed on the dielectric layer 700 by static electricity. The dielectric layer 700 may include a same material as the insulation layer 400. The dielectric layer 700 may include a transparent polymer material. In an embodiment, the dielectric layer 700 includes a polymer material, such as a polyimide.

As such, since light formed by illuminating may be irradiated to the substrate 10 through the transparent resin portion 120, the electrostatic chuck 1000 according to an exemplary embodiment may easily align the substrate 10 with respect to the electrostatic chuck 1000 by using the light.

That is, the electrostatic chuck 1000 on which the substrate 10 as an adsorption target is easily aligned is provided.

In addition, since the transparent resin portion 120 of the electrostatic chuck 1000 according to an exemplary embodiment is covered with the transparent cushion layer 200 such that the transparent resin portion 120 is not in contact with the substrate 10 as an adsorption target, the substrate 10 may be prevented or substantially prevented from becoming defective by the transparent resin portion 120. Since the electrostatic chuck 1000 is provided such that the substrate 10 as an adsorption target does not directly contact the transparent resin portion 120, the problem that may be caused by the transparent resin portion 120 may be prevented or substantially prevented.

Further, in the electrostatic chuck 1000 according to an exemplary embodiment, since the transparent cushion layer 200 is thicker than the dielectric layer 700, the transparent cushion layer 200 is deformed by the pressure due to the substrate 10, and, thus, the substrate 10 may be suppressed from being damaged by the pressure.

That is, the electrostatic chuck 1000 in which the substrate 10 as an adsorption target may be suppressed from being damaged is provided.

Still further, in the electrostatic chuck 1000 according to an exemplary embodiment, since the transparent resin portion 120 has a greater hardness than the transparent cushion layer 200, even though the transparent cushion layer 200 is deformed by the pressure due to the substrate 10, deformation of the transparent resin portion 120 may be suppressed by the transparent cushion layer 200.

Moreover, in the electrostatic chuck 1000 according to an exemplary embodiment, the transparent cushion layer 200 may cover an entire surface of the main body portion 100 including the transparent resin portion 120 and has lesser hardness than the transparent resin portion 120, such that the pressure due to the substrate 10 may be equally applied to an entire region of the transparent cushion layer 200, and, thus, one region of the transparent cushion layer 200 may be suppressed from being further deformed compared to another region thereof. Therefore, since the deformation of one region of the transparent cushion layer 200 caused by the pressure due to the substrate 10 is suppressed compared to the other region thereof, one portion of the substrate 10 corresponding to the one region of the transparent cushion layer 200 may be suppressed from being further deformed compared to the other portion thereof.

That is, the electrostatic chuck 1000 of which deformation caused by the pressure due to the substrate 10 as an adsorption target is suppressed is provided.

Herein, an electrostatic adsorption apparatus according to another exemplary embodiment will be described with reference to FIG. 3. The electrostatic adsorption apparatus according to another exemplary embodiment may include the electrostatic chuck according to the exemplary embodiment described above.

Figure 3:
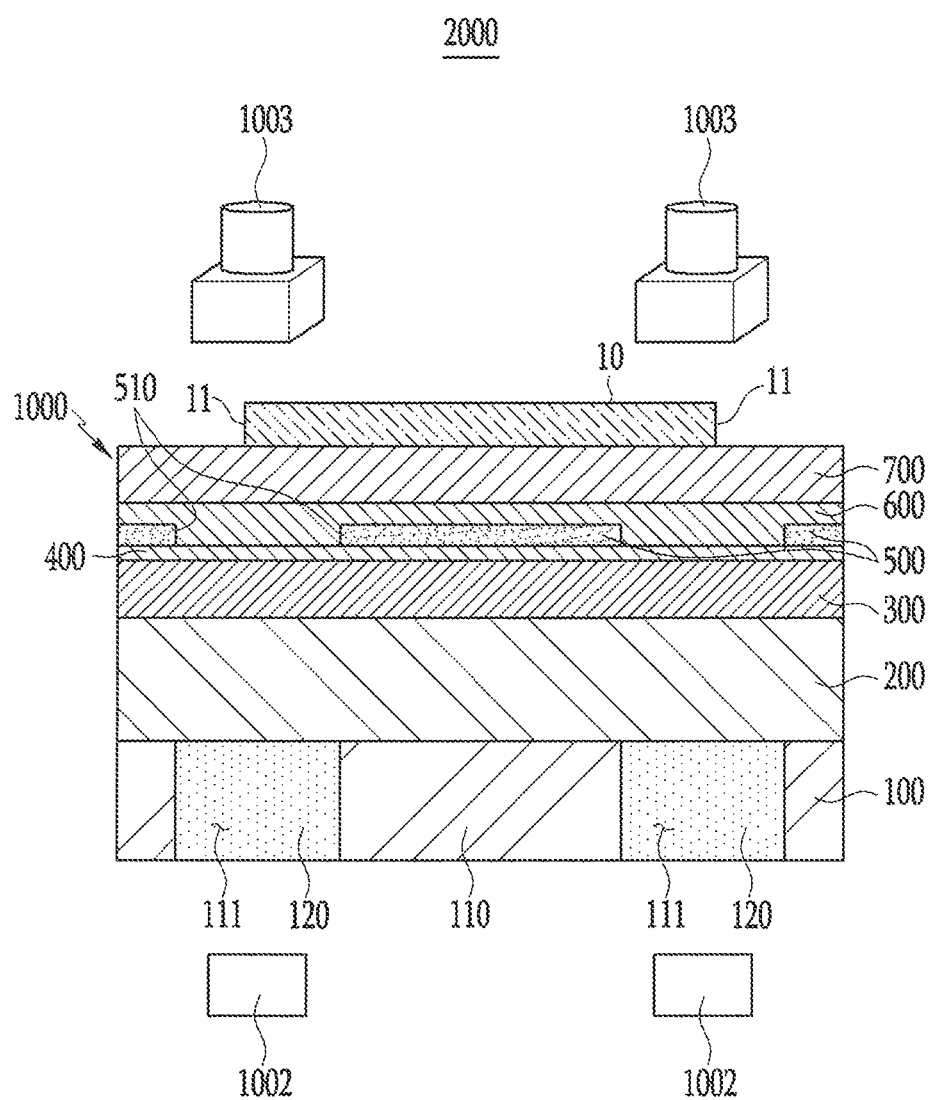
FIG. 3 illustrates a cross-sectional view of an electrostatic adsorption apparatus, according to another exemplary embodiment.

FIG. 3 illustrates a cross-sectional view of an electrostatic adsorption apparatus, according to another exemplary embodiment.

Referring to FIG. 3, an electrostatic adsorption apparatus 2000 according to another exemplary embodiment includes the electrostatic chuck 1000 for adsorbing the substrate 10 as an adsorption target by using static electricity, an illumination device 1002, and a camera 1003.

In an embodiment, the electrostatic chuck 1000 includes the main body portion 100, the transparent cushion layer 200, the first adhesive layer 300, the insulation layer 400, the electrode layer 500, the second adhesive layer 600, and the dielectric layer 700.

The illumination device 1002 is disposed below the main body portion 100. The illumination device 1002 corresponds to the transparent resin portion 120 of the main body portion 100. The illumination device 1002 irradiates light to the transparent resin portion 120, and the light passing through the transparent resin portion 120 passes through the transparent cushion layer 200, the first adhesive layer 300, the insulation layer 400, the electrode layer 500, the second adhesive layer 600, and the dielectric layer 700, and then is irradiated to the corner 11 of the substrate 10.

The camera 1003 is disposed above the dielectric layer 700. The camera 1003 corresponds to the transparent resin portion 120 of the main body portion 100. The camera 1003 photographs the corner 11 of the substrate 10 that is visible by the light irradiated to the substrate 10 through the transparent resin portion 120 of the electrostatic chuck 1000 from the illumination device 1002. It is possible to perform vision alignment of the substrate 10 with respect to the electrostatic chuck 1000 using an image captured by the camera 1003.

As such, according to the electrostatic adsorption apparatus 2000 of another exemplary embodiment, the light emitted from the illumination device 1002 is irradiated to the corner 11 of the substrate 10 through the transparent resin portion 120 to be captured by the camera 1003, and, thus, it is possible to easily perform vision alignment of the substrate 10 with respect to the electrostatic chuck 1000.

Herein, a process of bonding adsorption targets by using an electrostatic chuck according to an exemplary embodiment will be described with reference to FIG. 4.

Figure 4:
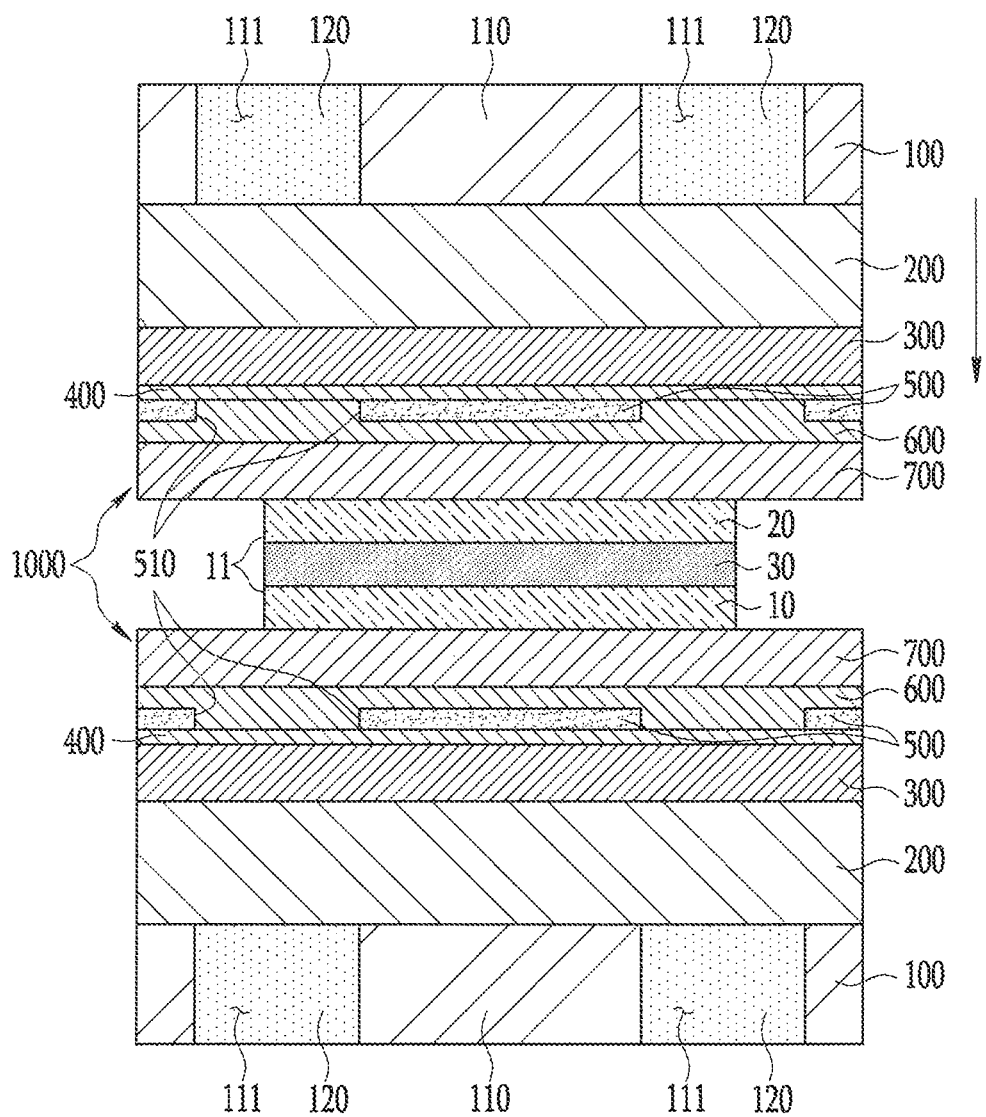
FIG. 4 illustrates a cross-sectional view of a bonding state between adsorption targets by an electrostatic chuck, according to an exemplary embodiment.

FIG. 4 illustrates a cross-sectional view of a bonding state between adsorption targets by an electrostatic chuck, according to an exemplary embodiment.

Referring to FIG. 4, the substrate 10 as an adsorption target, and a window 20 are adsorbed to each of different electrostatic chucks 1000. In this case, each of the substrate 10 and the window 20 may be vision-aligned in each of the different electrostatic chucks 1000.

Next, a resin layer 30 is disposed between the substrate 10 and the window 20, and a bonding process of the window 20 with respect to the substrate 10 is performed by pressing the different electrostatic chucks 1000 toward each other.

In an embodiment, while the bonding process between the substrate 10 and the window 20 is performed by the different electrostatic chucks 1000, the transparent cushion layer 200 of the electrostatic chuck 1000 may cover an entire surface of the main body portion 100 including the transparent resin portion 120 and has a hardness less than that of the transparent resin portion 120, such that the pressure due to the substrate 10 and the window 20 may be equally applied to an entire region of the transparent cushion layer 200 of each of the different electrostatic chucks 1000, and, thus, one region of the transparent cushion layer 200 of each of the different electrostatic chucks 1000 may be suppressed from being further deformed compared to another region thereof. Therefore, since the deformation of one region of the transparent cushion layer 200 of each of the different electrostatic chucks 1000 caused by the pressure due to the substrate 10 and the window 20 is suppressed compared to the other region thereof, one portion of each of the substrate 10 and the window 20 corresponding to the one region of the transparent cushion layer 200 of each of the different electrostatic chucks 1000 may be suppressed from being further deformed compared to the other portion thereof.

Therefore, since the resin layer 30 disposed between the substrate 10 and the window 20 may be evenly formed over an entire region of each of the substrate 10 and the window 20, the resin layer 30 may be suppressed from overflowing from outer peripheries of the substrate 10 and the window 20, and, concurrently (e.g., simultaneously), air bubbles inside the resin layer 30 may be suppressed from being generated, and, thus, the bonding process between the substrate 10 and the window 20 may be easily performed.

That is, the electrostatic chuck 1000 easily performing the bonding between the substrate 10 and the window 20 as adsorption targets is provided.

Herein, an experimental example in which an effect of the electrostatic chuck according to an exemplary embodiment was confirmed will be described with reference to FIG. 5 to FIG. 7. An electrostatic chuck according to the experimental example may be the electrostatic chuck 1000 described above according to the exemplary embodiment.

Figure 5:
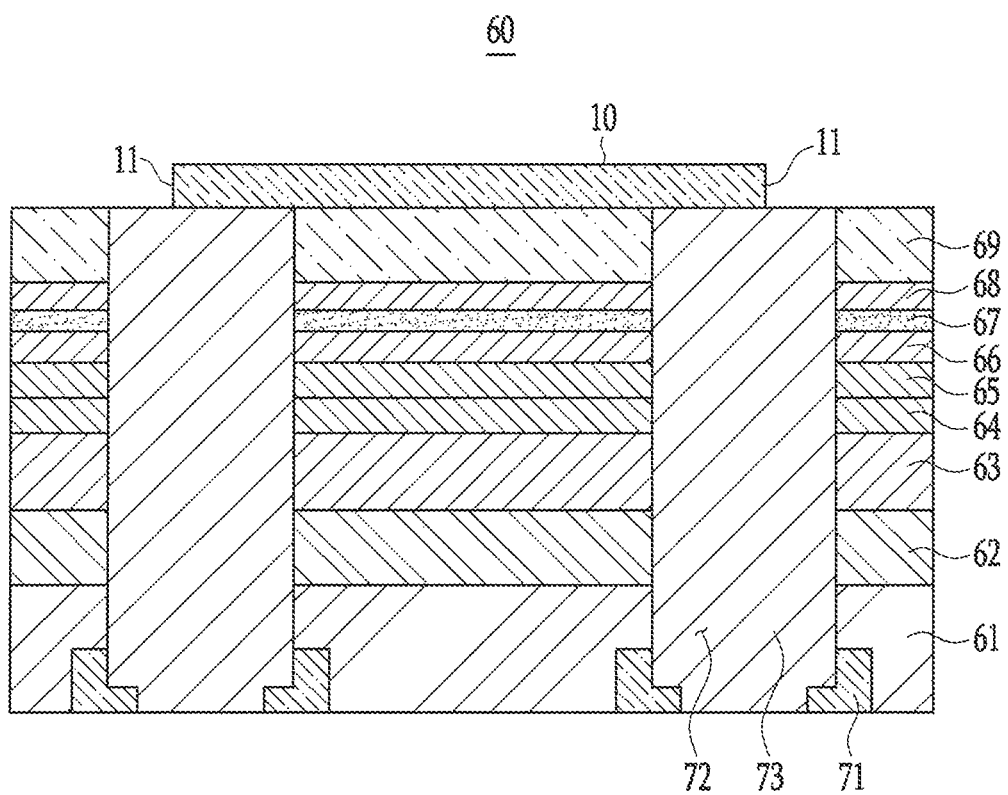
FIG. 5 illustrates a cross-sectional view of an electrostatic chuck according to a comparative example.

FIG. 5 illustrates a cross-sectional view of an electrostatic chuck according to a comparative example.

Referring to FIG. 5, an electrostatic chuck 60 according to a comparative example includes a main body portion 61, a cushion layer 62, a first adhesive layer 63, a first insulation layer 64, a second adhesive layer 65, a second insulation layer 66, an electrode layer 67, a third adhesive layer 68, a dielectric layer 69, a bracket 71, a through-hole 72, and a lens portion 73.

The main body portion 61 is made of aluminum. The cushion layer 62 is made of a black or white polyethylene (PE) based material. The first insulation layer 64 is made of a polyimide. The second insulation layer 66 is made of a polyimide. The electrode layer 67 is made of copper. The dielectric layer 69 is made of a polyimide. The bracket 71 supports the lens portion 73. The through-hole 72 passes through the main body portion 61, the cushion layer 62, the first adhesive layer 63, the first insulation layer 64, the second adhesive layer 65, the second insulation layer 66, the electrode layer 67, the third adhesive layer 68, and the dielectric layer 69. The lens portion 73 is made of silicone.

The lens portion 73 is filled in the through-hole 72. The lens portion 73 is exposed through the dielectric layer 69. The lens portion 73 is in contact with the corner 11 of the substrate 10 as an adsorption target.

FIG. 6 illustrates a table of respective conditions of an electrostatic chuck according to a comparative example and an electrostatic chuck according to an experimental example.

Referring to FIG. 6, in an electrostatic chuck according to a comparative example, a lens portion is made of silicone, a shore hardness of the lens portion is 85.5, the lens portion is supported by a bracket, a cushion layer is made of a polyethylene-based material, the cushion layer has a thickness of 0.6 mm, the cushion layer has a shore hardness of 85, the cushion layer is penetrated by the lens portion and a portion thereof corresponding to the lens portion is separated, and the cushion layer has a black or white color.

In an electrostatic chuck according to an experimental example, a transparent resin portion is made of high hardness polycarbonate (PC), a shore hardness of the transparent resin portion is 98, the transparent resin portion is press-fitted into a through-hole of a body portion, a transparent cushion layer is made of acrylic, a thickness of the transparent cushion layer is 1 mm, a shore hardness of the transparent cushion layer is 90, the transparent cushion layer covers the transparent resin portion to be integrally formed with an entire surface of a main body portion, and the transparent cushion layer is formed to be transparent.

FIG. 7 illustrates a result table for comparing an electrostatic chuck according to the comparative example and an electrostatic chuck according to the experimental example as described above with reference to FIG. 6.

Referring to FIG. 7, as evaluation conditions, a bonding depth between adsorption targets was 100 μm, a bonding holding time between the adsorption targets was 2 seconds, and a bonding process between the adsorption targets was performed at normal pressure and atmospheric conditions.

The electrostatic chuck according to the comparative example performed the bonding process between the adsorption targets 20,000 times, and the electrostatic chuck according to the experimental example performed the bonding process between the adsorption targets 90,000 times.

According to the result, in the electrostatic chuck according to the comparative example, as a deviation of pressed amounts of the cushion layer, a difference (Max-Min) between a maximum and a minimum of pressed amounts of the cushion layer was 65 μm, and an average (Avg) of the pressed amounts of the cushion layer was 28 μm.

In contrast, in the electrostatic chuck according to the experimental example, as a deviation of pressed amounts of the transparent cushion layer, a difference (Max-Min) between a maximum and a minimum of pressed amounts of the transparent cushion layer was 35 μm, and an average (Avg) of the pressed amounts of the transparent cushion layer was 19 μm.

That is, comparing the experimental example to the comparative example, it can be seen that the deviation of the pressed amounts of the transparent cushion layer of the electrostatic chuck according to the experimental example is smaller than that of the cushion layer of the comparative example.

Herein, an electrostatic chuck according to another exemplary embodiment will be described with reference to FIG. 8. Portions that are different from the electrostatic chuck according to the exemplary embodiment described above will now be described.

Figure 8:
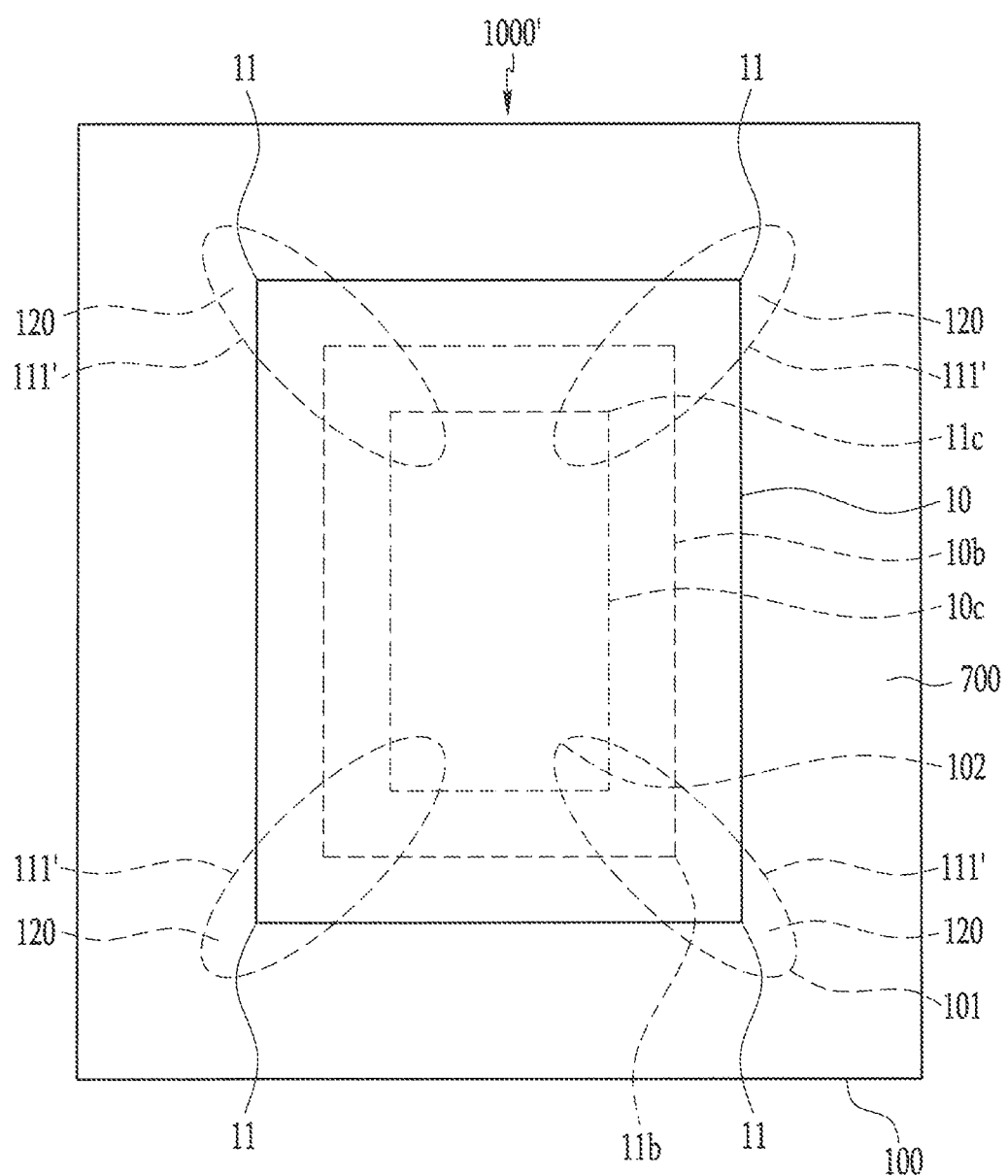
FIG. 8 illustrates a top plan view of an electrostatic chuck according to another exemplary embodiment.

FIG. 8 illustrates a top plan view of an electrostatic chuck according to another exemplary embodiment.

Referring to FIG. 8, an electrostatic chuck 1000' selectively adsorbs substrates 10, 10b, and 10c as adsorption targets of various sizes having a quadrangular shape in a planar view. Each of the substrates 10, 10b, and 10c has a quadrangular shape having four corners 11, 11b, and 11c, respectively, in a planar view.

In an embodiment, the electrostatic chuck 1000' includes the main body portion 100, the transparent cushion layer 200, the first adhesive layer 300, the insulation layer 400, the electrode layer 500, the second adhesive layer 600, and the dielectric layer 700.

The main body portion 100 includes the body portion 110 and the transparent resin portion 120.

The body portion 110 includes four through-holes 111' corresponding to the four corners 11, 11b, and 11c of the various-sized substrates 10, 10b, and 10c. The through-holes 111' correspond to the corners 11, 11b, and 11c of the substrates 10, 10b, and 10c, respectively. The through-holes 111' are formed to pass through the body portion 110. In an embodiment, the through-holes 111' have elliptical shapes in a planar view and extend from the corners 11, 11b, and 11c of the substrates 10, 10b, and 10c toward central regions of the substrates 10, 10b, and 10c, respectively.

The transparent resin portion 120 is filled in the through-hole 111'. In an embodiment, the transparent resin portion 120 is formed to be press-fitted into the through-hole 111'. In an embodiment, the number of the transparent resin portions 120 is four, and the four transparent resin portions 120 extend from first portions 101 of the main body portions 100 corresponding to the corners 11, 11b, and 11c of the substrates 10, 10b, and 10c to second portions 102 of the main body portion 100 corresponding to the central regions of the substrates 10, 10b, and 10c, respectively.

As such, in the electrostatic chuck 1000 according to another exemplary embodiment, the transparent resin portions 120 have elliptical shapes respectively extending from the first portions 101 of the main body portion 100 corresponding to the corners 11, 11b, and 11c of the various-sized substrates 10, 10b, and 10c to the second portions 102 of the main body portion 100 corresponding to the central regions of the substrates 10, 10b, and 10c, such that the transparent portions 120 may be used corresponding to sizes of the substrates 10, 10b, and 10c as various adsorption targets without replacing the transparent resin portion 120 or the electrostatic chuck 1000.

While this disclosure has been described in connection with what are presently considered to be some practical exemplary embodiments, it is to be understood that the present invention is not limited to the disclosed embodiments, but, on the contrary, is intended to cover various modifications and equivalent arrangements included within the spirit and scope of the appended claims.

What is claimed is:

1. An electrostatic chuck comprising:
a main body portion including a body portion provided with a through-hole, and a transparent resin portion filled in the through-hole;
a transparent cushion layer on the main body portion and covering the transparent resin portion;
an electrode layer on the transparent cushion layer; and
a dielectric layer on the electrode layer.

2. The electrostatic chuck of claim 1, wherein the transparent resin portion has a hardness greater than a hardness of the transparent cushion layer.

3. The electrostatic chuck of claim 1, wherein an adsorption target having a polygonal shape in a planar view is adsorbed on the dielectric layer, and the transparent resin portion corresponds to a corner of the adsorption target.

4. The electrostatic chuck of claim 3, wherein the adsorption target has a quadrangular shape in the planar view, the transparent resin portion includes four transparent resin portions, and the four transparent resin portions correspond to four corners of the adsorption target.

5. The electrostatic chuck of claim 3, wherein the adsorption target has a quadrangular shape in a planar view, and the transparent resin portion extends from a first portion of the main body portion corresponding to the corner of the adsorption target to a second portion of the main body portion corresponding to a central region of the adsorption target.

6. The electrostatic chuck of claim 1, wherein the transparent cushion layer is thicker than the electrode layer and the dielectric layer.

7. The electrostatic chuck of claim 1, wherein the transparent cushion layer is in contact with the transparent resin portion.

8. The electrostatic chuck of claim 1, further comprising:
a first adhesive layer between the transparent cushion layer and the electrode layer; and
an insulation layer between the first adhesive layer and the electrode layer.

9. The electrostatic chuck of claim 8, wherein the electrode layer is in contact with the insulation layer.

10. The electrostatic chuck of claim 8, further comprising a second adhesive layer between the electrode layer and the dielectric layer.

11. The electrostatic chuck of claim 8, wherein the insulation layer includes a same material as the dielectric layer.

12. The electrostatic chuck of claim 1, wherein the electrode layer is provided with an opening overlapping the transparent resin portion.

13. An electrostatic adsorption apparatus comprising:
an electrostatic chuck comprising:
a main body portion including a body portion provided with a through-hole, and a transparent resin portion filled in the through-hole;
a transparent cushion layer on the main body portion and covering the transparent resin portion;
an electrode layer on the transparent cushion layer; and
a dielectric layer on the electrode layer;
an illumination device arranged below the main body portion and corresponding to the transparent resin portion; and
a camera arranged above the dielectric layer and corresponding to the transparent resin portion.

* * * * *